United States Patent
Chen et al.

(10) Patent No.: US 12,452,609 B2
(45) Date of Patent: Oct. 21, 2025

(54) OFFSET REDUCTION FOR SILICON MICROPHONES

(71) Applicant: Infineon Technologies AG, Neubiberg (DE)

(72) Inventors: Hong Chen, Pogöriach (AT); Benno Muehlbacher, Villach-St. Magdalen (AT); Michael Reinhold, Erlangen (DE); Juergen Roeber, Stegaurach (DE); Andreas Wiesbauer, Pörtschach a. W. (AT)

(73) Assignee: Infineon Technologies AG, Neubiberg (DE)

( * ) Notice: Subject to any disclaimer, the term of this patent is extended or adjusted under 35 U.S.C. 154(b) by 332 days.

(21) Appl. No.: 18/151,628

(22) Filed: Jan. 9, 2023

(65) Prior Publication Data

US 2024/0236585 A1    Jul. 11, 2024

(51) Int. Cl.
*H04R 19/00*    (2006.01)
*H04R 3/04*    (2006.01)

(52) U.S. Cl.
CPC ............. *H04R 19/005* (2013.01); *H04R 3/04* (2013.01); *H04R 2201/003* (2013.01)

(58) Field of Classification Search
CPC ........ H04R 19/005; H04R 19/04; H04R 1/08; H04R 3/04; H04R 3/06; H04R 3/00; H04R 5/04; H04R 2201/003; H04R 2410/03; H04F 3/45475; H04F 3/45973; H04F 2203/45138; H04F 2203/45212; H04F 2203/45288; B81B 7/008
See application file for complete search history.

(56) References Cited

U.S. PATENT DOCUMENTS

| | | | |
|---|---|---|---|
| 2009/0322353 A1* | 12/2009 | Ungaretti ............. | G01L 9/0073 324/686 |
| 2013/0015919 A1* | 1/2013 | Kropfitsch ............... | H03F 1/38 330/260 |
| 2013/0051582 A1* | 2/2013 | Kropfitsch ............... | H03F 1/56 330/144 |
| 2014/0077882 A1* | 3/2014 | Draxelmayr ......... | H03G 1/0094 330/278 |
| 2015/0137834 A1* | 5/2015 | Steiner .................... | H04R 19/04 324/686 |
| 2016/0111954 A1* | 4/2016 | Bach ....................... | H04R 19/04 365/96 |
| 2018/0234763 A1* | 8/2018 | Ganta .................. | H03F 3/45475 |
| 2022/0353594 A1* | 11/2022 | Florian .................... | H04R 1/08 |
| 2022/0360894 A1* | 11/2022 | Carfore ................ | H10N 30/302 |

FOREIGN PATENT DOCUMENTS

CN    110740411 A    1/2020

* cited by examiner

*Primary Examiner* — Yogeshkumar Patel
(74) *Attorney, Agent, or Firm* — Slater Matsil, LLP (57) ABSTRACT

A microphone includes a first resistor circuit for receiving a bias voltage; an offset reduction circuit coupled to the first resistor circuit; a second resistor circuit coupled to the offset reduction circuit; an amplifier coupled to the second resistor circuit configured for receiving an input signal and generating an output signal; and a capacitor circuit coupled to the amplifier, the offset reduction circuit, and the second resistor circuit.

21 Claims, 4 Drawing Sheets

OFFSET REDUCTION FOR SILICON MICROPHONES

TECHNICAL FIELD

The present invention relates generally to an offset reduction circuit for a silicon microphone and, in particular embodiments, to an offset reduction method for a silicon microphone.

BACKGROUND

Silicon Microphones (SiMic) are generally known and typically include a capacitive MicroElectroMechanical System (MEMS) device for converting sound waves into an analog signal, readout circuitry including an amplifier for amplifying the analog signal, biasing circuitry, and an Analog-to-Digital Converter (ADC) for converting the amplified analog signal into a digital signal. Silicon microphones also typically include other analog and digital circuits in various product configurations. Silicon microphones are typically fabricated in one or more integrated circuits.

A high-ohmic pseudo-resistor block is often used for SiMic readout amplifier design in a "constant charge" readout scheme. In the "constant charge" readout scheme the capacitive element in the MEMS device has constant charge, and its capacitance varies in response to the sound waves. The resistors in the pseudo-resistor block can be realized by stacking anti-parallel Metal Oxide Silicon Field Effect Transistors (MOSFETs) operating in the deep-triode region to achieve an extremely high value resistor. The pseudo-resistor block realized in this fashion may result in a corresponding silicon microphone with limited noise, linearity, leakage robustness, and overload recovery performance.

Furthermore, the analog outputs for a differential analog silicon microphone must fulfill a certain offset specification to meet customer specifications. A large offset could cause a range reduction of the ADC coupled to the analog microphone outputs.

SUMMARY

According to an embodiment, a microphone comprises a first resistor circuit for receiving a bias voltage; an offset reduction circuit coupled to the first resistor circuit; a second resistor circuit coupled to the offset reduction circuit; an amplifier coupled to the second resistor circuit configured for receiving an input signal and generating an output signal; and a capacitor circuit coupled to the amplifier, the offset reduction circuit, and the second resistor circuit.

According to an embodiment, a microphone comprises a switched capacitor resistor circuit for receiving a bias voltage; a diode-based resistor circuit coupled to the switched capacitor resistor circuit; an amplifier coupled to the diode-based resistor circuit configured for receiving an input signal and generating an output signal; and a capacitor circuit coupled to the amplifier and the diode-based resistor circuit in a feedback loop configuration.

According to an embodiment, a method comprises providing a switched capacitor resistor circuit for receiving a bias voltage; coupling a diode-based resistor circuit to the switched capacitor resistor circuit; coupling an amplifier to the diode-based resistor circuit for receiving an input signal and generating an output signal; and coupling a capacitor circuit to the amplifier and the diode-based resistor circuit in a feedback loop configuration.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

According to embodiments, a tracking biasing scheme for a silicon microphone provides state-of-the-art noise, linearity, leakage robustness and overload recovery performance. In a differential embodiment, the tracking biasing scheme includes an offset reduction circuit and method.

Figure 1:
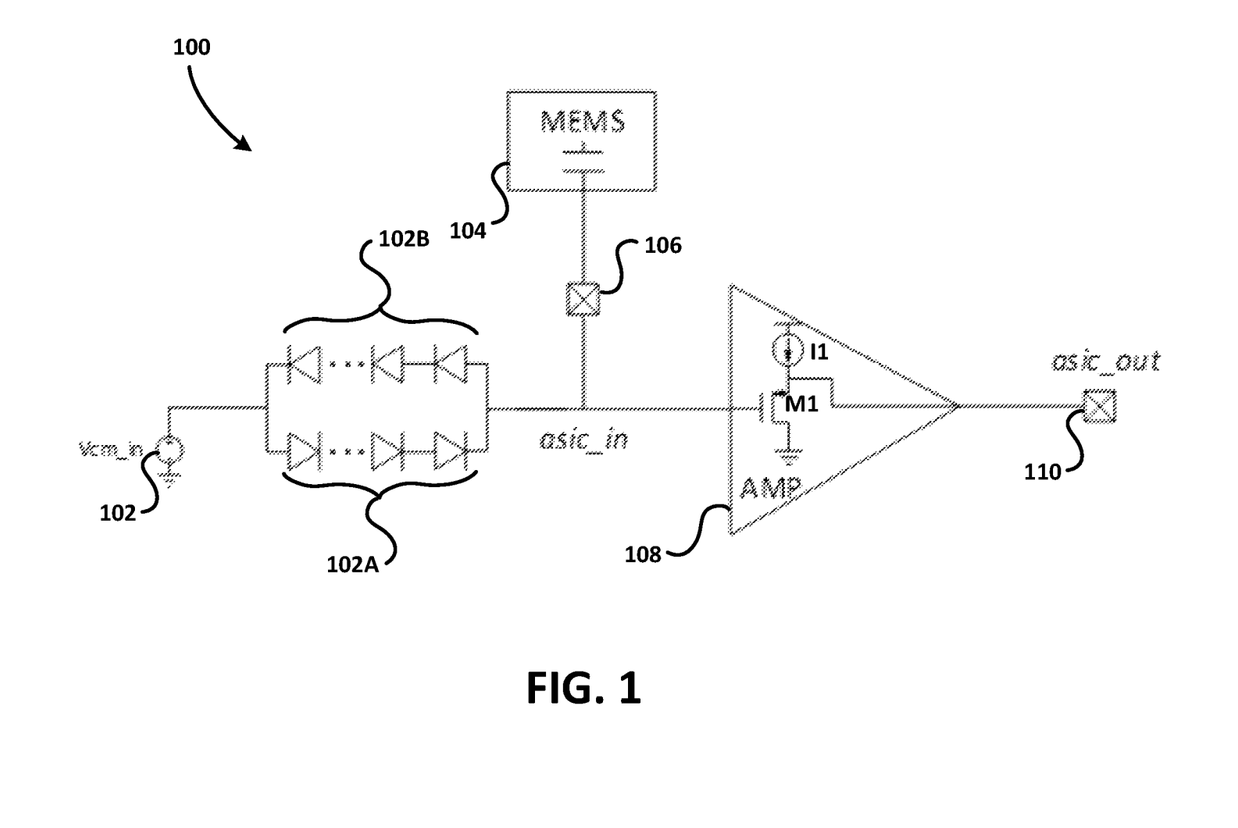
FIG. 1 is a schematic diagram of a readout circuit for an exemplary silicon microphone.

FIG. 1 is a schematic diagram of a readout circuit for an exemplary single-ended silicon microphone 100. Exemplary single-ended silicon microphone 100 includes an amplifier 108 in a source follower configuration. The source follower includes a P-channel transistor M1 coupled to a bias current source I1. The gate of P-channel transistor M1 is coupled to the input of amplifier 108 and is labeled "asic_in." The input of amplifier 108 can be brought out to a pad 106 of an Application-Specific Integrated Circuit (ASIC), which can include amplifier 108 and other silicon microphone components. The source of P-channel transistor M1 is coupled to the output of amplifier 108 and is labeled "asic_out." The output of amplifier 108 can be brought out to a pad 110 of the ASIC. A capacitive MEMS device 104 is coupled to pad 106. Biasing circuitry includes a plurality of diode-connected MOSFETs (diodes) in a stacked anti-parallel configuration including a first set of diodes 102A and a second set of diodes 102B. The diodes operate in the deep-triode region used to realize a high value resistor. Two sets of diodes 102A and 102B are used to assure linearity for both positive and negative swings of the analog signal on pad 106. The first set of diodes 102A and second set of diodes 102B are coupled between a source of common voltage (Vcm_in) and pad 106.

Figure 4:
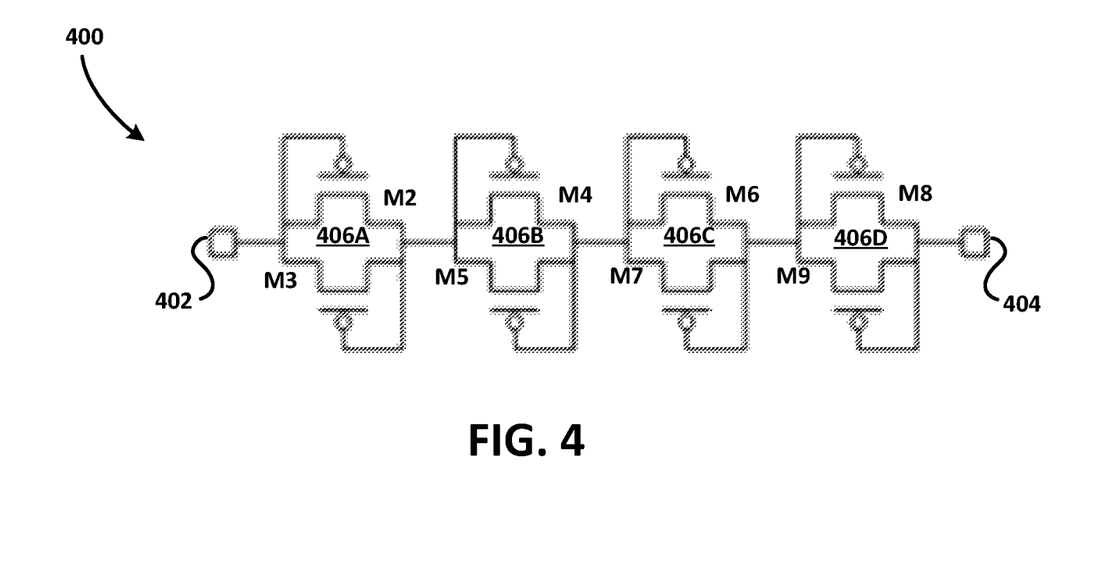
FIG. 4 is a schematic diagram of a resistor circuit comprising a plurality of stacked transistors in a diode-connected configuration.

FIG. 4 is a resistor circuit 400 comprising a plurality of stacked transistors in a diode-connected configuration. Resistor circuit 400 corresponds to the first set of diodes 102A and the second set of diodes 102B shown in FIG. 1. Thus, resistor circuit 400 shows a plurality of four sets of diodes in an anti-parallel configuration, including diode sets 406A, 406B, 406C, and 406D. The diode sets are coupled together in series connection between nodes 402 and 404. Diode set 406A comprises diode-connected transistors M2 and M3 coupled together in an anti-parallel configuration, diode set 407B comprises diode-connected transistors M4 and M5 coupled together in an anti-parallel configuration, diode set 407C comprises diode-connected transistors M6 and M7 coupled together in an anti-parallel configuration, and diode set 406D comprises diode-connected transistors M8 and M9 coupled together in an anti-parallel configuration. In each of the diode sets, one of the transistors has a first source/drain coupled to a gate of the transistor, whereas the other of the transistors has a second source/drain coupled to the gate of the transistor. This is done to increase linearity of the resistor with respect to the polarity of the applied input signal. The biasing of the diode-connected transistors shown in FIG. 4 helps to assure operation in the deep-triode region of operation, and the high value of resistance desired for "constant charge" biasing of a silicon microphone.

In FIG. 1, the anti-parallel diodes are used as "pseudo-resistors," in which the transistors used to realize the "pseudo-resistors" work in the deep-triode region as previously described. Hereinafter, the "pseudo-resistors" will be referred to simply as resistors for the sake of convenience and clarity. The resistors are not fully conducting in the deep-triode region when biased in the manner shown in FIG. 4. The anti-parallel (two paths) configuration shown in FIG. 4 is used to ensure linearity in both positive and negative signal swing. In FIG. 1, with positive swing added upon the diodes at pad 106 'asic_in', the upper branch is 'on' while the lower branch is 'off', and vice versa. In FIG. 1, a sufficient number of diodes is used in both branches so when one side is on, full conduction will not occur but only reduced resistance and thus good linearity can still be guaranteed. As long as the linearity is kept within specification limits, a small reduction of resistance in the case of large signal swing may be acceptable for most applications.

While the exemplary single-ended silicon microphone 100 generally provides good overall performance, the biasing circuit shown in FIG. 1 may result in limited noise, linearity, leakage robustness, and overload recovery performance in some applications.

Figure 2:
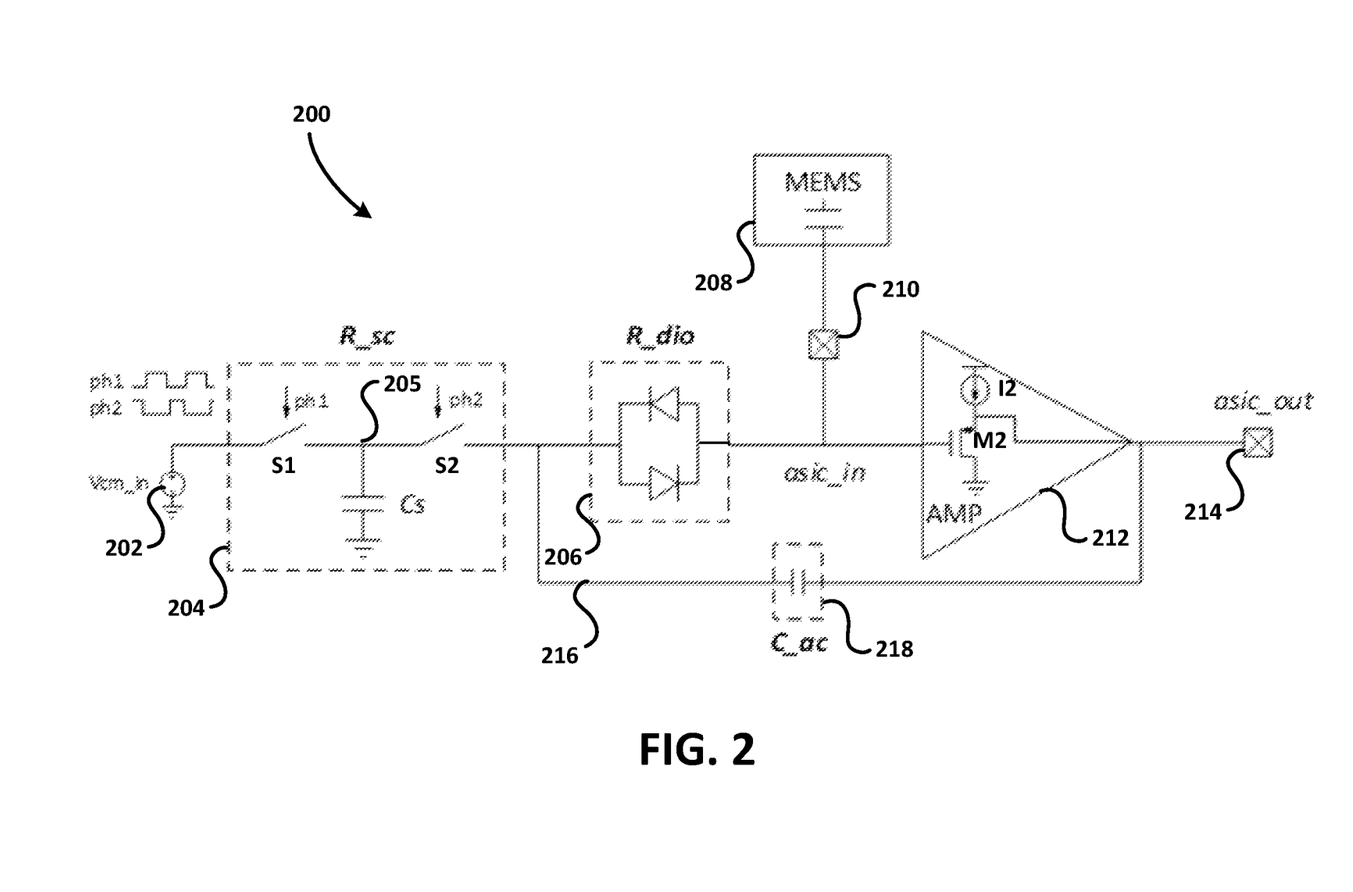
FIG. 2 is a schematic diagram of a single-ended readout circuit for a silicon microphone including tracking biasing according to an embodiment.

FIG. 2 is a schematic diagram of a single-ended readout circuit for a silicon microphone 200 including tracking biasing according to an embodiment. Silicon microphone 200 includes an amplifier 212 in a source follower configuration. Other amplifier configurations can be used in other embodiments. The source follower includes a P-channel transistor M2 coupled to a bias current source 12. The gate of P-channel transistor M2 is coupled to the input of amplifier 212 and is labeled "asic_in." The input of amplifier 212 can be brought out to a pad 210 of an Application-Specific Integrated Circuit (ASIC), which can include amplifier 212 and other silicon microphone components. The source of P-channel transistor M2 is coupled to the output of amplifier 212 and is labeled "asic_out." The output of amplifier 212 can be brought out to a pad 214 of the ASIC. A capacitive MEMS device 208 is coupled to pad 210. Tracking of the output voltage of amplifier 212 is provided by a feedback capacitor 218 designated "C_ac" that is coupled between pad 214 and circuit node 216. Tracking of the output voltage is described in further detail below.

Biasing circuitry for silicon microphone 200 includes a diode circuit 206 that includes two diode-connected MOSFETs (diodes) in an anti-parallel configuration including a first diode and a second diode, in an embodiment. The diodes of diode circuit 206 both operate in the deep-triode region to realize a high value resistor, which is designated "R_dio". The value of "R_dio" is ideally in the Gigohm range (10^9 ohms). Two diodes in diode circuit 206 are used to assure linearity for both positive and negative swings of the analog signal on pad 210. Diode circuit 206 is coupled between circuit node 216 and pad 214. The two diodes in diode circuit 206 are shown in further detail in FIG. 4. For example, the two diodes of diode circuit 206 can be implemented using only one of the diode sets of FIG. 4 such as diode set 406A, including diode-connected P-channel transistor M2 and diode-connected P-channel transistor M3.

Returning now to FIG. 2, the biasing circuitry also includes a switched capacitor circuit 204 for implementing another high value biasing resistor designated "R_sc." Switched capacitor circuit 204 is coupled between a common mode reference voltage source 202 designated "Vcm_in" and circuit node 216. Switched capacitor circuit 204 includes a first switch S1 for receiving a first phase switching control signal "ph1" coupled to internal node 205, and a second switch S2 for receiving a second phase switching control signal "ph2" also coupled to internal node 205. As can be seen in FIG. 2, the first phase switching control signal "ph1" and the second phase switching control signal "ph2" are of opposite phase and non-overlapping, in an embodiment. Switched capacitor circuit 204 also includes a capacitor C2 coupled between internal node 205 and ground. Since the value of the "R_sc" resistor is also ideally in the Gigohm range, the value of capacitor Cs is small. Since the first and second phase switching control signals have a frequency that will not generate spurious signals in the audio band, the value of capacitor Cs may be in the femtofarad range (10^-15 Farads). Thus, capacitor Cs can be implemented with a metal-oxide capacitor or even by parasitic capacitance of internal node 205 in some embodiments.

The tracking biasing of silicon microphone 200 is thus composed of an anti-parallel MOSFET implemented diode circuit 206 (R_dio), a highly linear resistor implemented by switched capacitor circuit 204 (R_sc), and a feedback capacitor 218 used to couple (track) the AC signal from the output of amplifier 212 to the biasing chain through feedback capacitor 218 (C_ac). Optionally, a process and temperature (PT) compensation block can be added to the anti-parallel diode of diode circuit 206, making the full biasing chain insensitive to PT variations.

The R_dio diode circuit 206 provides most of the needed impedance (i.e., 495G ohm in a 500G ohm biasing system), as it is the main noise contributor. The larger the value of the R_dio resistance, the less in-band noise will be generated. The R_sc switched capacitor resistor of switched capacitor circuit 204 provides the remainder of the total needed impedance (i.e., 5G ohm in a 500G ohm biasing system). The switched capacitor resistor R_sc, together with C_ac, forms a high-pass filter which passes the AC signal from PGA output to the bottom side of the R_dio. The high-pass filter implementation is how the tracking biasing scheme is formed, in an embodiment. The corner frequency (fc) of the high-pass tracking path is defined by the following equation: fc=1/(2*pi*R_sc*C_ac). The corner frequency (fc) should be set below the audio band to not interfere with the normal operation of silicon microphone 200. For example, a corner frequency (fc) on the order of 1-10 Hz is desirable.

The DC bias voltage 'Vcm_in' defines the DC operating point at input node 'asic_in'. This voltage level is related to the supply voltage and amplifier structure. The output DC voltage is equal to the input DC level plus a Vgs shift (gate-source voltage shift) of the amplifier input source follower transistor M2. In order to maximize the dynamic range of amplifier 212, the output DC voltage is set a voltage between the supply voltage and ground. For example, in the case of a PMOS input source follower structure used in amplifier 212 and a 1.5V single supply voltage, the DC level for Vcm_in and asic_in are about '0.75V-Vgs', which is then typically in the range of ~0.2V to ~0.5V. The output DC voltage is kept at 0.75V. In some special cases a slightly higher output DC voltage is used (for example 0.8V), for input node linearity considerations.

The tracking scheme described above with respect to the silicon microphone 200 of FIG. 2 results in several advantages when compared to the exemplary single-ended silicon microphone 100 shown in FIG. 1. For example, only one pair of anti-parallel diodes in diode circuit 206 is sufficient to accommodate a full scale input signal without significant distortion, simplifying the design of silicon microphone 200 greatly. Further, as resistor R_sc is implemented by a switched capacitor circuit 204, it is inherently linear. Therefore, resistor R_sc can be designed to be sufficiently low in impedance (5G ohm as noted above) without degrading linearity at low frequencies. The exact corner frequency of the high-pass filter is not critical as long as it is below the normal audio band of silicon microphone 200.

As the tracking loop breaks in the case of a shock (overload) event, the effective impedance of R_dio quickly drops after the shock event. Immediately after the shock event, the R_sc resistor has a relatively low impedance value. Therefore, the full remaining biasing impedance during the shock event is low. This feature advantageously enables a fast recovery after shock event.

In summary, the tracking scheme includes several advantages briefly described below. Most of the biasing impedance is implemented by the single pair of anti-parallel diodes in diode circuit 206, which results in a good Signal-to-Noise Ratio (SNR). Signal tracking in silicon microphone 200 described above assures good linearity. Better leakage robustness at the input node can be achieved using the tracking biasing design, due to the implementation of the biasing resistors as described above.

It should be noted that the R_sc switched capacitor resistor can also be implemented by using two or more stacked diode-connected MOSFETs. However, due to large process and temperature variations of such implementations, a fairly large R_sc value has to be used to leave enough safety margin for worst case process and temperature corners. Otherwise the corner frequency (fc) may not be low enough for a desired low frequency input signal (i.e., 20 Hz), and thus linearity at low frequencies may be compromised. On the other hand, a high impedance value for R_sc is also not desired as it reduces the usable R_dio resistor, and therefore decreases SNR. In addition, a high impedance value for R_sc leads to slow overload recovery performance and worse leakage robustness.

Implementing process and temperature (PT) compensation for a stacked MOSFET resistor circuit is a possible solution for these issues, but such a PT compensation is relatively costly in implementation, from both area and power perspectives.

Accordingly, R_sc is implemented by using switched-cap biasing, wherein R_sc=1/(fclk*Cs), wherein folk is the frequency of the control signals "ph1" and "ph2." The switched capacitor implementation results in a resistor that is process, voltage and temperature (PVT) stable and inherently linear. A precise value of resistor R_sc thus eliminates the necessity of leaving a large resistance margin in the design and a low and optimum value can be calculated for R_sc.

The value of the corner frequency (fc) can be relaxed in embodiments, as even if signal tracking is not perfect at low frequency, a linear R_sc can still guarantee good overall linearity. The value of folk should be selected higher than 20 kHz to avoid clock spurs in the audio band. The value of capacitor Cs is then in the range of several fF, as noted above, in order to achieve a resistance of ~5 Gohm or higher. Such a small capacitor value may suffer from mismatch in case of a differential readout system. The associated offset between the differential channels should therefore be removed. Such an offset reduction circuit and method is described below with respect to the differential silicon microphone embodiment of FIG. 3.

Figure 3:
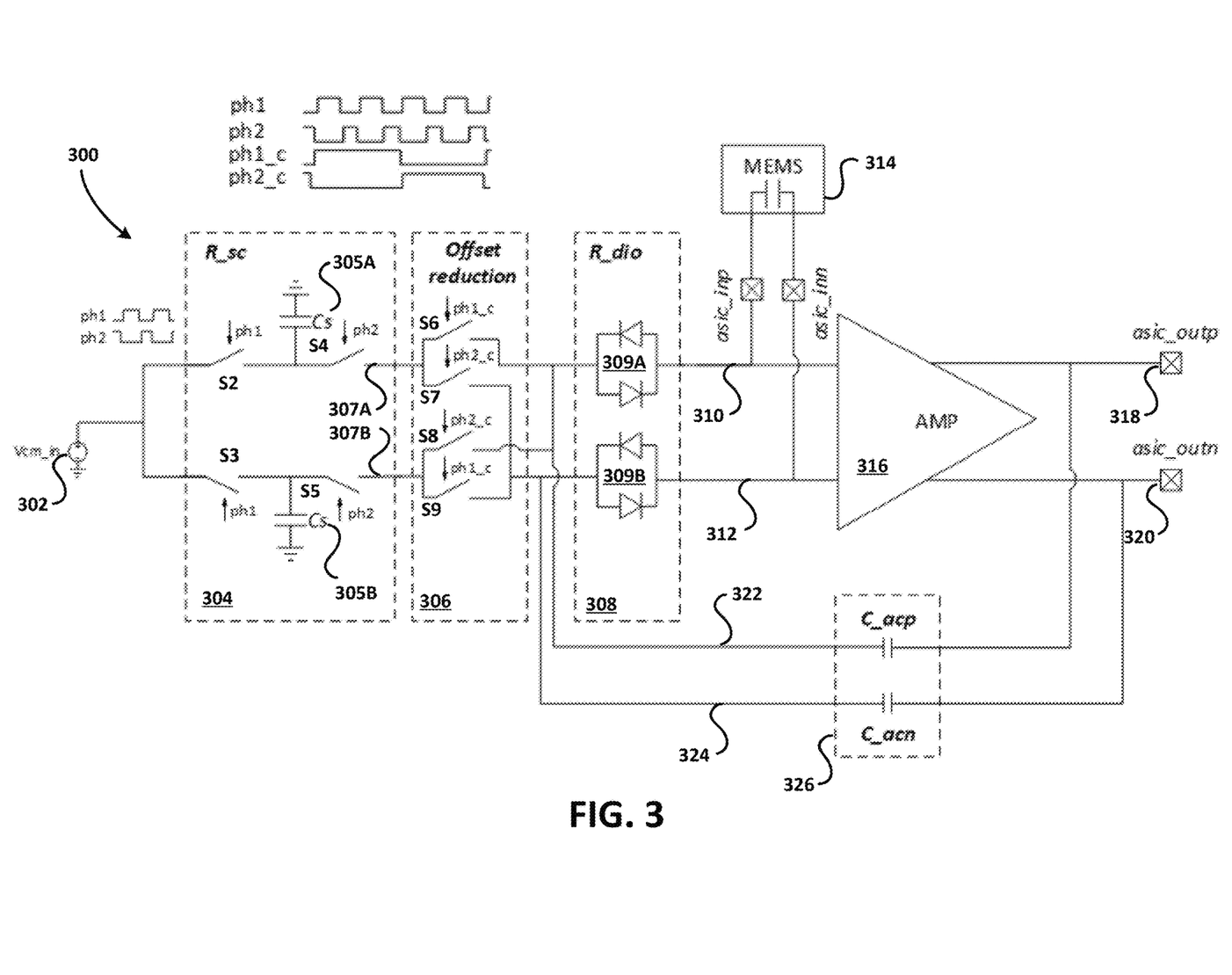
FIG. 3 is a schematic diagram of a differential readout circuit for a silicon microphone including tracking biasing and offset reduction, according to an embodiment.

FIG. 3 is a schematic diagram of a differential readout circuit for a silicon microphone 300 including tracking biasing and offset reduction, according to an embodiment. In pertinent part, silicon microphone includes a differential amplifier 316, biasing resistor circuit 304 and biasing resistor circuit 308, an offset reduction circuit 306, a capacitive MEMS device 314, and a capacitive feedback path 326.

Differential amplifier 316 can comprise a source follower configuration in each channel, previously described. Differential amplifier 316 has a first input coupled to circuit node 310 (asic_inp) and a first input coupled to circuit node 318 (asic_outp). Circuit node 310 and circuit node 318 can comprise pins of an ASIC including differential amplifier 316 as well as other analog and digital components, in an embodiment. Differential amplifier 316 has a second input coupled to circuit node 312 (asic_inn) and a second output coupled to circuit node 320 (asic_outn).

Biasing resistor circuit 304 (designated R_sc) corresponds to previously described switched capacitor circuit 204 shown in FIG. 2, however including two individual switched capacitor circuits to implement two individual biasing resistors for the differential implementation of silicon microphone 300. A first switched capacitor resistor includes switches S2 and S4, as well as capacitor 305A having a capacitance value of Cs. Switches S2 and S4 are controlled by first and second control signals "ph1" and "ph2" previously described. A second switched capacitor resistor includes switches S3 and S5, as well as capacitor 305B also having a capacitance value of Cs. Switches S3 and S5 are also controlled by first and second control signals "ph1" and "ph2" previously described. Switches S2, S3, S4, and S5 can comprise one or more transistors in an embodiment. The inputs of biasing resistor circuit 304 are both coupled to a source of common mode reference voltage 302 (Vcm_in).

Biasing resistor circuit 308 (designated R_dio) corresponds to previously described diode circuit 206, but with a first set of anti-parallel diodes in diode set 309A and a second set of anti-parallel diodes in diode set 309B corresponding to the two differential signal paths. The anti-parallel diodes are biased in the deep-triode region to realize high value resistors, and can be implemented with diode-connected transistors as is shown in FIG. 4. For example, the first set of anti-parallel diodes in diode set 309A and the second set of anti-parallel diodes in diode set 309B can be implemented by diode set 406A shown in FIG. 4.

Offset reduction circuit 306 comprises switches S6, S7, S8, and S9, first and second inputs, and first and second outputs. Switch S6 is coupled between the first input and the first output, switch S7 is coupled between the first input and the second output, switch S8 is coupled between the second input and the first output, and switch S9 is coupled between the second input and the second output. Switches S6 and S9 are controlled by control signals "ph1_c." Switches S7 and S8 are controlled by control signals "ph2_c." The "ph1_c" and "ph2_c" control signals have opposite polarities and are of a lower frequency than the "ph1" and "ph2" control signals. The first and second inputs of offset reduction circuit 306 are coupled to the first and second outputs of biasing resistor circuit 304, and the first and second outputs of offset reduction circuit 306 are coupled to the first and second inputs of biasing resistor circuit 308. The operation of the offset reduction circuit 306 is explained in detail below.

Capacitive MEMS device 314 has a differential output coupled to the asic_inp and asic_inn pins. Capacitive MEMS device 314 generates an analog differential output signal in response to ambient sound waves. Capacitive MEMS device can be integrated in a separate integrated device, or together with the ASIC described above in some embodiments.

Capacitive feedback path 326 includes a first capacitor C_acp coupled between circuit nodes 318 and 322 and a second capacitor C_acn 326 coupled between circuit nodes 320 and 324. The value of capacitors C_acp and C_acn are chosen such that the corner frequency of the tracking circuitry is set below the audio band to not interfere with the normal operation of silicon microphone 300. For example, a corner frequency (fc) on the order of 1-10 Hz is desirable. In an embodiment, the values of capacitors C_acp and C_acn are set to be equal.

To minimize the offset, the outputs of the main offset contributor are averaged. This is done so that the output 307A and output 307B of the switched capacitance resistors, which are the biggest offset contributors, are either connected to diode set 309A or diode set 309B. In the first clock cycle, output 307A is connected to the input of diode set 309A and output 307B is connected to the input of diode set 309B. In the next clock cycle, output 307A is applied to diode set 309B and output 307B is applied to diode set 309A. Using the above switching method, the offset is averaged and therefore reduced significantly.

In summary, a silicon microphone has been shown as described using a tracking bias circuit comprising a capacitive signal tracking feedback loop (C_ac) coupled to the junction between the high ohmic diodes (R_dio) and a switched capacitance resistor block (R_sc). The switched capacitor resistor block defines the DC operating point for the high ohmic diodes. To achieve a desired resistance of greater than 5G Ohm a clock with a frequency above 20 kHz is used to operate the switched capacitance resistor block. This is done to avoid clock spurs inside the audio band. To achieve the desired resistance value given the clock frequency constraints, a capacitance of about 1-2 fF is used. In the differential embodiment, these small values lead to a mismatch between the two differential outputs and therefore may result in a significant offset in some implementations. An offset reduction is therefore used comprising a switch block that effectively averages the values of the resistors in the switched capacitor resistor block. The outputs are alternated are alternatively connected to a first set of bias diodes or a second set of bias diodes. The operation of the offset reduction circuit allows the offset to be averaged out and significantly reduced.

The silicon microphones described herein can be fabricated in one or more integrated circuits housed in one or more semiconductor packages. The silicon microphones described herein can also be fabricated in a single standalone product including other processing circuitry such as ADCs, filters, as well as other analog and digital signal processing circuits in a wide range of products according to embodiments. The silicon microphones described herein can also be fabricated as embedded in various other products and systems according to embodiments.

The following table summarizes the simulation results of 500 Monte Carlo runs, using global (change of global parameters such as threshold voltages of all devices or absolute sheet resistance of all resistors used) and local (mismatch of parts located next to each other, e.g. neighboring transistors or resistors) offset mismatches. The first column of the table shows the results wherein the offset reduction function is activated. The second column of the table shows the results wherein the offset reduction function is de-activated. It can be seen from an inspection of the table that the offset mean value, the offset standard deviation, and the offset maximum value are all advantageously significantly reduced when the offset reduction function is activated.

|  | Offset Reduction Activated | Offset Reduction De-Activated |
| --- | --- | --- |
| Offset Mean Value (µV) | 9 | −20 |
| Offset Standard Deviation (mV) | 0.16 | 1.8 |
| Offset Maximum Value (mV) | ±0.5 | ±5 |

Example embodiments of the present invention are summarized here. Other embodiments can also be understood from the entirety of the specification and the claims filed herein.

Example 1. According to an embodiment, a microphone comprises a first resistor circuit for receiving a bias voltage; an offset reduction circuit coupled to the first resistor circuit; a second resistor circuit coupled to the offset reduction circuit; an amplifier coupled to the second resistor circuit configured for receiving an input signal and generating an output signal; and a capacitor circuit coupled to the amplifier, the offset reduction circuit, and the second resistor circuit.

Example 2. The microphone of Example 1, wherein the first resistor circuit comprises a switched capacitor circuit.

Example 3. The microphone of any of the above examples, wherein the switched capacitor circuit comprises a switched metal or parasitic capacitor.

Example 4. The microphone of any of the above examples, wherein the switch capacitor circuit comprises a differential switched capacitor circuit.

Example 5. The microphone of any of the above examples, wherein the offset reduction circuit comprises a differential switching circuit.

Example 6. The microphone of any of the above examples, wherein the differential switching circuit comprises a plurality of switches coupled between a differential input and a differential output in an alternating polarity configuration.

Example 7. The microphone of any of the above examples, wherein the second resistor circuit comprises at least one diode-connected transistor.

Example 8. The microphone of any of the above examples, wherein the second resistor circuit comprises at least one pair of diode coupled in an anti-parallel configuration.

Example 9. The microphone of any of the above examples, wherein the amplifier comprises a differential amplifier.

Example 10. The microphone of any of the above examples, wherein the amplifier comprises a programmable gain amplifier.

Example 11. The microphone of any of the above examples, wherein the capacitor circuit comprises a first capacitor coupled between a first output of the amplifier and a first output of the offset reduction circuit; and a second capacitor coupled between a second output of the amplifier and a second output of the offset reduction circuit.

Example 12. The microphone of any of the above examples, further comprising a capacitive MEMS (Micro Electro Mechanical System) device for generating the input signal.

Example 13. According to an embodiment, a microphone comprises a switched capacitor resistor circuit for receiving a bias voltage; a diode-based resistor circuit coupled to the switched capacitor resistor circuit; an amplifier coupled to the diode-based resistor circuit configured for receiving an input signal and generating an output signal; and a capacitor circuit coupled to the amplifier and the diode-based resistor circuit in a feedback loop configuration.

Example 14. The microphone of Example 13, further comprising an offset reduction circuit interposed between the switched capacitor resistor circuit and the diode-base resistor circuit.

Example 15. The microphone of any of the above examples, wherein the offset reduction circuit comprises a differential input, a differential output, and a plurality of switches coupled between the differential input and the differential output in an alternating polarity switching configuration.

Example 16. The microphone of any of the above examples, further comprising a capacitive MEMS (Micro Electro Mechanical System) device for generating the input signal.

Example 17. According to an embodiment, a method comprises providing a switched capacitor resistor circuit for receiving a bias voltage; coupling a diode-based resistor circuit to the switched capacitor resistor circuit; coupling an amplifier to the diode-based resistor circuit for receiving an input signal and generating an output signal; and coupling a capacitor circuit to the amplifier and the diode-based resistor circuit in a feedback loop configuration.

Example 18. The method of Example 17, further comprising interposing an offset reduction circuit between the switched capacitor resistor circuit and the diode-base resistor circuit.

Example 19. The method of any of the above examples, wherein the offset reduction circuit comprises a differential input, a differential output, and a plurality of switches coupled between the differential input and the differential output, and wherein the offset reduction circuit alternates a polarity between the differential input and the differential output.

Example 20. The method of any of the above examples further comprising providing a capacitive MEMS (Micro Electro Mechanical System) device for generating the input signal.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A microphone comprising:
    a first resistor circuit for receiving a bias voltage;
    an offset reduction circuit coupled to the first resistor circuit;
    a second resistor circuit coupled to the offset reduction circuit;
    an amplifier coupled to the second resistor circuit configured for receiving an input signal and generating an output signal; and
    a capacitor circuit coupled to the amplifier, the offset reduction circuit, and the second resistor circuit.

2. The microphone of claim 1, wherein the first resistor circuit comprises a switched capacitor circuit.

3. The microphone of claim 2, wherein the switched capacitor circuit comprises a switched metal or parasitic capacitor.

4. The microphone of claim 2, wherein the switched capacitor circuit comprises a differential switched capacitor circuit.

5. The microphone of claim 1, wherein the offset reduction circuit comprises a differential switching circuit.

6. The microphone of claim 5, wherein the differential switching circuit comprises a plurality of switches coupled between a differential input and a differential output in an alternating polarity configuration.

7. The microphone of claim 1, wherein the second resistor circuit comprises at least one diode-connected transistor.

8. The microphone of claim 1, wherein the second resistor circuit comprises at least one pair of diodes coupled in an anti-parallel configuration.

9. The microphone of claim 1, wherein the amplifier comprises a differential amplifier.

10. The microphone of claim 1, wherein the amplifier comprises a programmable gain amplifier.

11. The microphone of claim 1, wherein the capacitor circuit comprises:
    a first capacitor coupled between a first output of the amplifier and a first output of the offset reduction circuit; and
    a second capacitor coupled between a second output of the amplifier and a second output of the offset reduction circuit.

12. The microphone of claim 1, further comprising a capacitive MEMS (Micro Electro Mechanical System) device for generating the input signal.

13. A microphone comprising:
    a switched capacitor resistor circuit for receiving a bias voltage;
    a diode-based resistor circuit coupled to the switched capacitor resistor circuit;
    an amplifier coupled to the diode-based resistor circuit configured for receiving an input signal and generating an output signal; and a capacitor circuit coupled to the amplifier and the diode-based resistor circuit in a feedback loop configuration.

14. The microphone of claim 13, further comprising an offset reduction circuit interposed between the switched capacitor resistor circuit and the diode-based resistor circuit.

15. The microphone of claim 14, wherein the offset reduction circuit comprises a differential input, a differential output, and a plurality of switches coupled between the differential input and the differential output in an alternating polarity switching configuration.

16. The microphone of claim 13, further comprising a capacitive MEMS (Micro Electro Mechanical System) device for generating the input signal.

17. A method comprising:
provide a switched capacitor resistor circuit for receiving a bias voltage;
coupling a diode-based resistor circuit to the switched capacitor resistor circuit;
coupling an amplifier to the diode-based resistor circuit for receiving an input signal and generating an output signal; and
coupling a capacitor circuit to the amplifier and the diode-based resistor circuit in a feedback loop configuration.

18. The method of claim 17, further comprising interposing an offset reduction circuit between the switched capacitor resistor circuit and the diode-base resistor circuit.

19. The method of claim 18, wherein the offset reduction circuit comprises a differential input, a differential output, and a plurality of switches coupled between the differential input and the differential output, and wherein the offset reduction circuit alternates a polarity between the differential input and the differential output.

20. The method of claim 17, further comprising providing a capacitive MEMS (Micro Electro Mechanical System) device for generating the input signal.

21. The microphone of claim 2, wherein the switched capacitor circuit comprises a single-ended switched capacitor circuit.

* * * * *

UNITED STATES PATENT AND TRADEMARK OFFICE
CERTIFICATE OF CORRECTION

PATENT NO. : 12,452,609 B2  
APPLICATION NO. : 18/151628  
DATED : October 21, 2025  
INVENTOR(S) : Chen et al.

Page 1 of 1

It is certified that error appears in the above-identified patent and that said Letters Patent is hereby corrected as shown below:

In the Claims

In Column 12, in Claim 18, Line 6, delete "diode-base" and insert -- diode-based --.

Signed and Sealed this  
Thirteenth Day of January, 2026

John A. Squires  
*Director of the United States Patent and Trademark Office*